(12) United States Patent
Yoshioka

(10) Patent No.: US 8,054,093 B2
(45) Date of Patent: Nov. 8, 2011

(54) SENSOR THRESHOLD CIRCUIT

(75) Inventor: Sayaka Yoshioka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 435 days.

(21) Appl. No.: 12/446,880

(22) PCT Filed: Sep. 4, 2008

(86) PCT No.: PCT/JP2008/065979
§ 371 (c)(1),
(2), (4) Date: Apr. 23, 2009

(87) PCT Pub. No.: WO2009/041241
PCT Pub. Date: Apr. 2, 2009

(65) Prior Publication Data
US 2009/0315575 A1    Dec. 24, 2009

(30) Foreign Application Priority Data

Sep. 28, 2007  (JP) ................................. 2007-255983

(51) Int. Cl.
*G01R 27/08* (2006.01)

(52) U.S. Cl. .................... 324/705; 330/298; 235/462.25; 73/774; 324/706

(58) Field of Classification Search .................... 324/705
See application file for complete search history.

(56) References Cited

U.S. PATENT DOCUMENTS

| 5,923,024 | A  | * | 7/1999  | Wray ......................... 235/462.25 |
| 6,803,776 | B2 | * | 10/2004 | So et al. ......................... 324/706 |
| 7,609,075 | B2 | * | 10/2009 | Panhofer ......................... 324/705 |
| 2007/0096829 | A1 | * | 5/2007 | Woong et al. ..................... 330/298 |
| 2007/0186663 | A1 | * | 8/2007 | Chang et al. ..................... 73/774 |

FOREIGN PATENT DOCUMENTS

| JP | 06-090143   | 3/1994 |
| JP | 10-038931   | 2/1998 |
| JP | 2001-108480 | 4/2001 |
| JP | 2008-203201 | 9/2008 |
| JP | 2008-203202 | 9/2008 |

* cited by examiner

*Primary Examiner* — Timothy J Dole
*Assistant Examiner* — Benjamin M Baldridge
(74) *Attorney, Agent, or Firm* — Morgan, Lewis & Bockius LLP

(57) ABSTRACT

There is provided a sensor threshold circuit that makes available a hysteresis width that is not dependent on the change in a threshold point. Since a bias current $I_B$ is generated by a threshold current $I_T$ and a threshold adjusting current $I_{CONT}$, the threshold point is given by a coefficient A and a coefficient K and the hysteresis width |BH| is given by the coefficient K. Accordingly, when the coefficient K is determined, the hysteresis width |BH| is not dependent on the coefficient A and keeps a constant value. In addition, since the coefficient A depends on the resistance ratio, the threshold point is variable by changing a single resistor. Further, when the coefficient K is determined, the hysteresis width |BH| is also determined to be a single value with no variations in its value, no changes according to temperature, and no changes over time.

8 Claims, 12 Drawing Sheets

F I G. 9
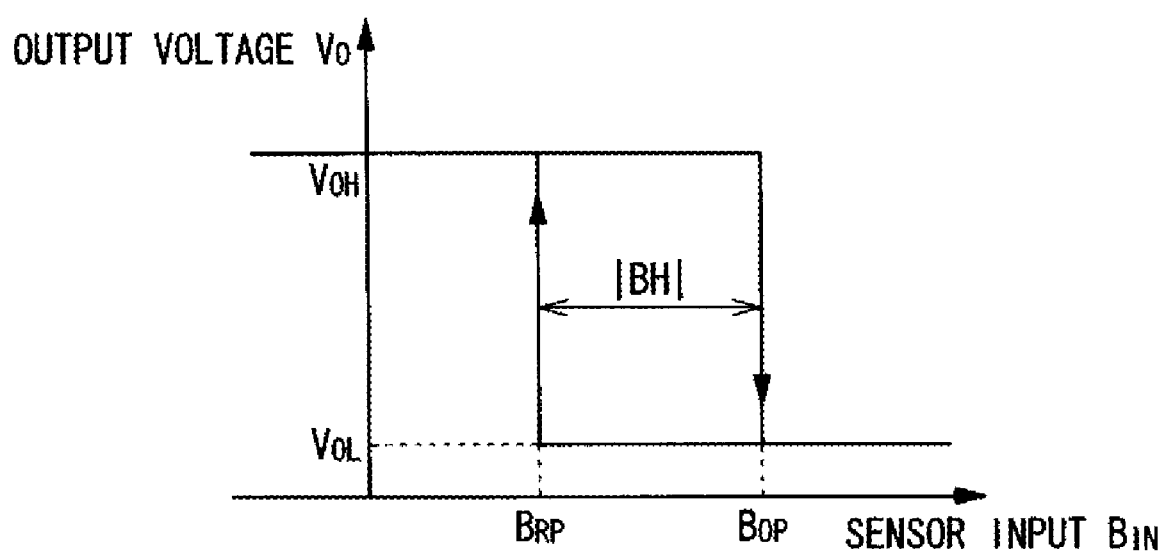

SENSOR THRESHOLD CIRCUIT

TECHNICAL FIELD

The present invention relates to sensor threshold circuits applicable to various types of sensors, and more particularly, to a sensor threshold circuit that determines a threshold point for digitizing a sensor output by use of a product of a sensor output impedance and a bias current.

BACKGROUND ART

FIG. 8 shows a conventional sensor threshold circuit. This sensor threshold circuit includes: a four-terminal sensor 10; a voltage comparator 20; a sensor drive current detecting circuit 30; a sensor bias current generating circuit 50; and a bias current switching circuit 70, and obtains a sensor output voltage $V_{SO}$ (=$V_P$−$V_N$) by use of a sensor input $B_{IN}$ applied from the exterior, for instance, magnetic field. In this configuration, the bias current switching circuit 70 switches between resistors $R_O$ and $R_R$ to change a sensor bias current $I_B$, whereby a digital output voltage $V_O$ with a hysteresis characteristic as shown in FIG. 9 is made available in receipt of the sensor input $B_{IN}$ (See Patent Document 1, for example).

FIG. 9 is a circuit diagram indicative of the relationship between the sensor input $B_{IN}$ and the output voltage $V_O$ in the sensor threshold circuit with the hysteresis characteristic. When the sensor input $B_{IN}$ is increased, the output voltage $V_O$ is decreased from $V_{OH}$ to $V_{OL}$ at a threshold point $B_{OP}$. On the other hand, when the sensor input $B_{IN}$ is decreased, the output voltage $V_O$ is increased from $V_{OL}$ to $V_{OH}$ in an opposite manner at a threshold point $B_{RP}$ smaller than threshold point $B_{OP}$. Accordingly, the digital output voltage $V_O$ with a hysteresis width |BH| is obtainable.

Next, the operation of the conventional threshold circuit will be described with reference to FIG. 8.

Firstly, the threshold point occurring when a switch $SW_O$ is conductive and a switch $SW_R$ is opened in the bias current switching circuit 70 of FIG. 8 will be described with reference to FIG. 10. For brief description, FIG. 10 shows a circuit configuration indicative of the four-terminal sensor 10, the voltage comparator 20, and the sensor bias current $I_{BO}$ extracted, with the switch $SW_O$ conductive and the $SW_R$ opened, from the bias current switching circuit 70 of FIG. 8.

In order to facilitate the analysis, firstly, it is assumed that a resistance value of a resistor $R_S$ for detecting a sensor drive current $I_S$ is considered to be much smaller than the resistance values of sensor resistors $R_1$, $R_2$, $R_3$, and $R_4$. It is also assumed that a drive terminal voltage $V_{CC}2$ be equal to a sensor drive voltage $V_{CC}$, accordingly. The resistance value of a sensor drive current detecting resistor $R_S$ may take any value, because the result to be produced later will exhibit that the threshold point is not dependent on the sensor drive voltage $V_{CC}$.

At this point, the current $I_{BO}$ generated by the sensor bias current generating circuit 50 is shown as the following expression (1), where $I_S$ represents the sensor drive current.

$$I_{BO}=I_S \times R_S/R_O \quad (1)$$

For simplification, a current mirror ratio $1/K_O$ is defined as follows.

$$1/K_O=R_S/R_O \quad (2)$$

Now, as shown in FIG. 10, the following expressions (3a) to (3c) are satisfied, where $I_1$ represents current flowing through the sensor resistor $R_1$, $I_2$ represents current flowing through the sensor resistors $R_3$ and $R_4$, $V_P$ represents a connection point of the sensor resistors $R_1$ and $R_2$, and $V_N$ represents the potential of the connection point of the sensor resistors $R_3$ and $R_4$.

$$I_1=(V_{CC}-V_P)/R_1 \quad (3a)$$

$$I_2=V_{CC}/(R_3+R_4) \quad (3b)$$

$$V_P/R_2=I_1+(I_1+I_2)/K_O \quad (3c)$$

When $V_P$ is solved, $$V_P=V_{CC}\times[(1+1/K_O)/R_1+1/\{K_O\times(R_3+R_4)\}]/(1/R_2+(1+1/K_O)/R_1) \quad (4)$$

is satisfied. The voltage comparator 20 switches at the voltage satisfying $V_P=V_N$, thereby forming the following expression (5).

$$V_{CC}\times[(1+1/K_O)/R_1 1/\{K_O\times(R_3+R_4)\}]/\{1/R_2+(1+1/K_O)/R_1\}=R_4\times V_{CC}/(R_3+R_4) \quad (5)$$

In the four-terminal sensor 10, in response to the sensor input $B_{IN}$ applied from the exterior, it is assumed that the balance be lost among the resistors $R_1$, $R_2$, $R_3$, and $R_4$, thereby resulting in $R_1=R_4=R+\Delta R$, $R_2=R_3=R-\Delta R$, or $R_1=R_4=R-\Delta R$, $R_2=R_3=R+\Delta R$. The sensor output voltage $V_{SO}$ (=$V_P$−$V_N$) will be generated. Accordingly, if $R_1=R_4=R+\Delta R$ and $R_2=R_3=R-\Delta R$ are satisfied, the expression (5) is formed as follows:

$$[(1+1/K_O)/(R+\Delta R)+1/\{K_O\times(R-\Delta R+R+\Delta R)\}]/(1/(R-\Delta R)+(1+1/KO)/(R+\Delta R))=(R+\Delta R)/(R-\Delta R+R+\Delta R) \quad (6)$$

Then, $\Delta R/R$ satisfying the above expression (6) is solved.

$$\Delta R/R = 1/[(2 \times K_O \times \{1 + 1/(2 \times K_O)\}] \quad (7)$$

$$\approx 1/(2 \times K_O) \equiv B_{OP}$$

That is to say, $\Delta R/R$ satisfying the above expression (7) is the threshold point $B_{OP}$. In this sense, the output voltage from a general sensor ranges from several hundreds microvolts to several tens millivolts, whereas the sensor drive voltage substantially ranges from 1 V to 5 V. Approximation is achieved with $K_O$ considered to be a sufficiently great value.

Likewise, the threshold point occurring when the switch $SW_O$ is opened and the switch $SW_R$ is conductive in the bias current switching circuit 70 of FIG. 8 will be described with reference to FIG. 11. For brief description, FIG. 11 shows a circuit configuration indicative of the four-terminal sensor 10, the voltage comparator 20, and the sensor bias current $I_{BR}$ extracted, with the $SW_O$ opened and the switch $SW_R$ conductive, from the bias current switching circuit 70 of FIG. 8.

At this point, current $I_{BR}$ generated by the sensor bias current generating circuit 50 is shown as the following expression (8).

$$I_{BR}=I_S \times R_S/R_R \quad (8)$$

For simplification, a current mirror ratio $1/K_R$ is defined as follows.

$$1/K_R=R_S/R_R \quad (9)$$

Here, the current is defined as shown in FIG. 11, so the current mirror ratio $1/K_O$, in a case where $I_{BO}$ represents the sensor bias current, is equal to $1/K_R$, and considered in the same manner. $\Delta R/R$ is given by the following expression (10), when $V_P=V_N$ is satisfied.

$$\Delta R/R \approx 1/(2 \times K_R) \equiv B_{RP} \quad (10)$$

That is to say, $\Delta R/R$ satisfying the above expression (10) is the threshold point $B_{RP}$.

The hysteresis width |BH|, which is produced by switching between the switch $SW_O$ and the switch $SW_R$ in the bias current switching circuit 70, will now be discussed.

The hysteresis width |BH| is obtained by the following expression (11).

$$|BH| = |B_{OP} - B_{RP}| \quad (11)$$
$$= |1/(2 \times K_O) - 1/(2 \times K_R)|$$
$$= |R_S \times (1/R_O - 1/R_R)/2|$$

FIG. 12 depicts the relationship of the threshold points $B_{OP}$ and $B_{RP}$, the hysteresis width |BH|, and the sensor drive current detecting resistor $R_S$ which are obtained from the above expressions (7), (10), and (11).

As shown in FIG. 12, in the conventional sensor threshold circuit, it turns out that when the threshold point is varied by changing the resistor $R_S$ of the sensor drive current detecting circuit 30, the hysteresis width |BH| is also varied. This is also exhibited by the above expression (11).

Patent Document 1: JP 2001-108480 A

It is to be noted, however, that when the threshold point is varied by changing the resistor $R_S$ as described above in the conventional sensor threshold circuit, the hysteresis width |BH| is also varied in the same manner. The hysteresis width |BH| reduces the variations in the output caused by sensor output noises. Hence, when the threshold point is varied, there is a drawback in that the influences of the output variations caused by the sensor output noises are different depending on the threshold point, due to the variations in the hysteresis width |BH|.

Moreover, when the threshold point is varied by changing the resistor $R_O$ and the resistor $R_R$, the hysteresis width |BH| that is not dependent on the change in the threshold point is obtainable. However, two output terminals are needed to change the two resistors, thereby leading to another drawback of increasing the chip area and chip costs.

The present invention has been made in view of the above drawbacks, and has an object of providing a sensor threshold circuit that enables variations in a threshold point by changing a single resistor to achieve a hysteresis width that is not dependent on the variations in the threshold point.

DISCLOSURE OF THE INVENTION

According to an aspect of the present invention, there is provided a sensor threshold circuit that outputs a digital signal with a hysteresis characteristic, in receipt of an input from a sensor, the sensor threshold circuit comprising: a voltage comparator that digitizes an output voltage of the sensor; a sensor drive current detecting circuit that detects a sensor drive current; a sensor bias current generating circuit that generates a threshold current of 1/K (where K>0) times of the sensor drive current that has been detected by the sensor drive current detecting circuit, based upon the output from the voltage comparator; a threshold adjusting current generating circuit that generates a threshold adjusting current of 1/A (where A>0) times of the sensor drive current that has been detected by the sensor drive current detecting circuit, adds or subtracts the threshold adjusting current to or from the threshold current that has been generated by the sensor bias current generating circuit to generate a sensor bias current, and supplies the sensor bias current to an output terminal of the sensor.

The above configuration may further include a bias current switching circuit that switches between a first resistor and a second resistor, based upon an output from the voltage comparator, wherein the sensor bias current generating circuit generates the threshold current, based upon the first resistor or the second resistor connected by the bias current switching circuit.

In the above configuration, the threshold adjusting current generating circuit may include: a first resistor for changing a threshold point with a sensor drive voltage used as a reference; second and third resistors for changing the threshold point with GND used as the reference; and an operating amplifier, and said 1/A satisfies a following expression, $1/A = (R_S/R_A/2) \times (1 - R_C/R_B)$, where $R_A$ represents a resistance value of the first resistor, $R_B$ and $R_C$ (where $R_B > R_C$) represent resistance values of the second and third resistors, respectively, and $R_S$ represents a resistance value of a resistor in the sensor drive current detecting circuit.

In the above configuration, at least one of the first, second, and third resistors may be a variable resistor.

In the above configuration, the threshold adjusting current generating circuit may include: a first resistor for changing a threshold point with a sensor drive voltage used as a reference; and an operating amplifier, and said 1/A satisfies a following expression, $1/A = R_S/R_A$, where $R_A$ represents a resistance value of the first resistor, and $R_S$ represents a resistance value of a resistor in the sensor drive current detecting circuit.

In the above configuration, the first resistor may be a variable resistor.

In the above configuration, $1/K = R_S/R_O$ may be formed when only the first resistor is conductive, and $1/K = R_S/R_R$ may be formed when only the second resistor is conductive, where $R_O$ represents a resistance value of the first resistor and $R_R$ represents a resistance value of the second resistor.

In the above configuration, the sensor may be a four-terminal sensor and may be any one of Hall element, magnetic resistive element, strain sensor, pressure sensor, temperature sensor, and acceleration sensor.

According to an aspect of the present invention, as described above, since a threshold current $I_T$ and a threshold adjusting current $I_{CONT}$, which are produced by the sensor drive current, generate a bias current $I_B$, the hysteresis width |BH| is given by the resistance ratio K. Accordingly, when a resistance ratio (coefficient) K is determined, the hysteresis width |BH| is not dependent on a coefficient A changing the threshold point, and keeps a constant value. Meanwhile, when the resistance ratio K is determined, the hysteresis width |BH| is also determined to be a single value with no variations in its value, no changes according to temperature, and no changes over time. Therefore, according to an aspect of the present invention, there is an effect of providing a sensor threshold circuit that makes available the hysteresis width |BH| that is not dependent on the variations in a threshold point.

BRIEF DESCRIPTION OF THE DRAWINGS

FIG. 9 shows the relationship between a sensor input and an output voltage of the sensor threshold circuit with a hysteresis characteristic;

Figure 1:
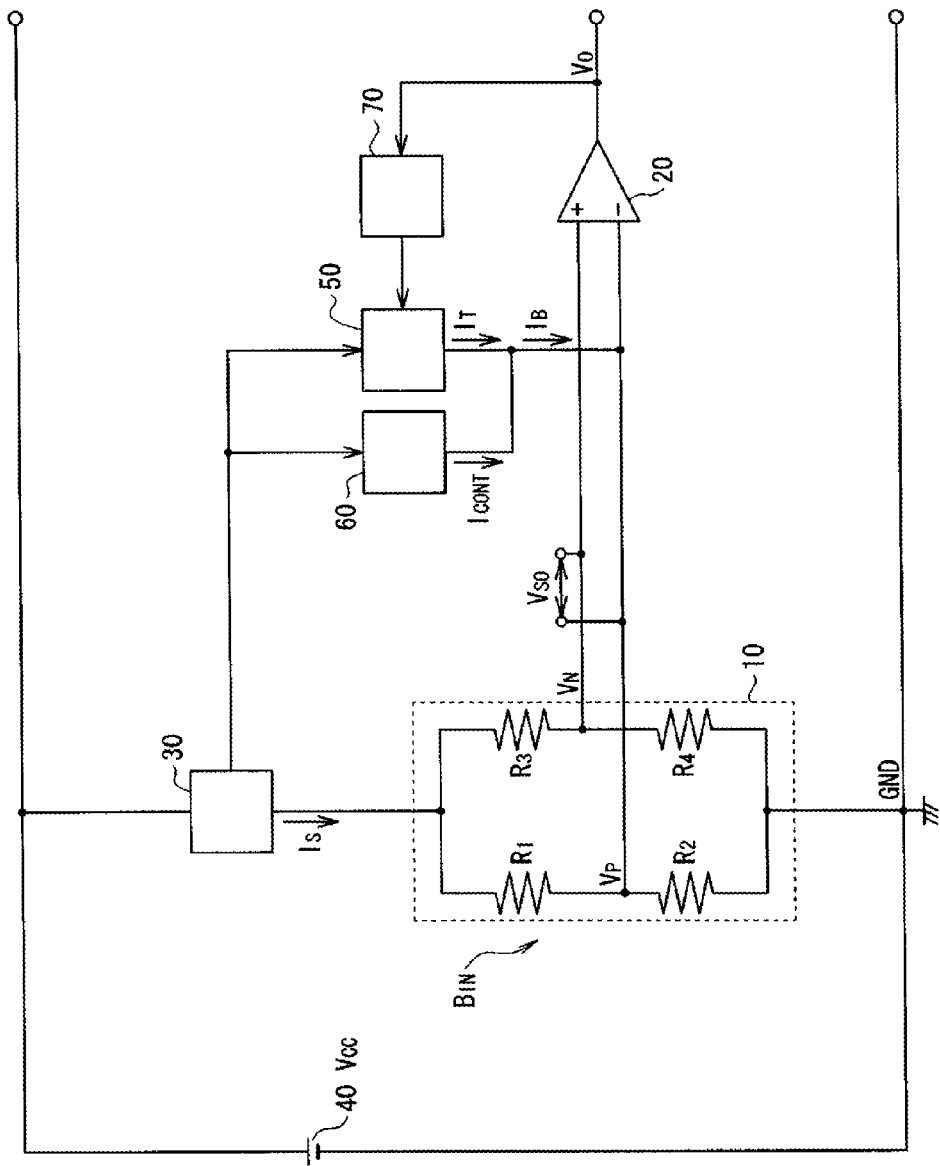
FIG. 1 illustrates a conceptual view of a configuration of a sensor threshold circuit according to a first embodiment of the present invention.

EXPLANATION OF REFERENCES 10 four-terminal sensor, 20 voltage comparator, 30 sensor drive current detecting circuit, 40 sensor drive voltage source, 50 sensor bias current generating circuit, 60 threshold adjusting current generating circuit, 70 bias current switching circuit, 52, 61, 62 operating amplifier, 51, 63, 64 PMOS transistor, 65, 66, 67 NMOS transistor, 71 inverter, $SW_O$, $SW_R$ switch, $R_1$, $R_2$, $R_3$, $R_4$, $R_S$, $R_O$, $R_R$, $R_A$, $R_B$, $R_C$ resistor

BEST MODE FOR CARRYING OUT THE INVENTION

The embodiments of the present invention will now be described with reference to the accompanying drawings. In the drawings, like references are used to denote corresponding parts with each other in all of the drawings, and the description for the overlapping parts will be omitted as necessary.

First Embodiment

Configuration of First Embodiment

FIG. 1 illustrates a conceptual view of a configuration of a sensor threshold circuit according to a first embodiment of the present invention.

The sensor threshold circuit includes: a four-terminal sensor 10; a voltage comparator 20; a sensor drive current detecting circuit 30; a sensor drive voltage source 40; a sensor bias current generating circuit 50; a threshold adjusting current generating circuit 60; and a bias current switching circuit 70.

The four-terminal sensor 10 is a resistance type four-terminal sensor, and is any one of Hall elements, magnetic resistive elements, strain sensors, pressure sensors, temperature sensors, and acceleration sensors, for example.

In the sensor threshold circuit, a sensor bias current $I_B$, which has been generated by the sensor bias current generating circuit 50 and the threshold adjusting current generating circuit 60, is supplied to an output terminal of the four-terminal sensor 10, so that a hysteresis characteristic is made available at a sensor output voltage $V_{SO}$ ($=V_P-V_N$), by use of a voltage drop resulted from a product of $I_B \times R_{OUT}$, where $I_B$ represents a sensor bias current and $R_{OUT}$ represents an impedance of an output terminal $V_P$ of the four-terminal sensor 10.

In the sensor threshold circuit with such a configuration, the sensor drive current $I_S$ is detected with the use of the sensor drive current detecting circuit 30, and a threshold current $I_T$, which is 1/K (K>0) times of the sensor drive current $I_S$, is generated at the sensor bias current generating circuit 50. In this sense, K has two values due to the control of the bias current switching circuit 70, so the sensor bias current generating circuit 50 generates two threshold currents $I_{TO}$ and $I_{TR}$.

The threshold adjusting current $I_{CONT}$, which is 1/A (A>0) times of the sensor drive current $I_S$ is produced at the threshold adjusting current generating circuit 60 and the threshold current $I_T$ and the threshold adjusting current $I_{CONT}$ are added or subtracted, so as to generate the sensor bias current $I_{BO}$.

A key point of the sensor threshold circuit according to an aspect of the present invention is configured to produce the threshold current $I_T$ and the threshold adjusting current $I_{CONT}$ based upon the sensor drive current $I_S$, so as to generate the sensor bias current $I_{BO}$ by adding or subtracting the threshold adjusting current $I_{CONT}$ to or from the threshold current $I_T$.

In order to facilitate the understanding of the present invention, the threshold current $I_T$ and the threshold adjusting current $I_{CONT}$ of FIG. 1 will be discussed firstly.

Figure 2:
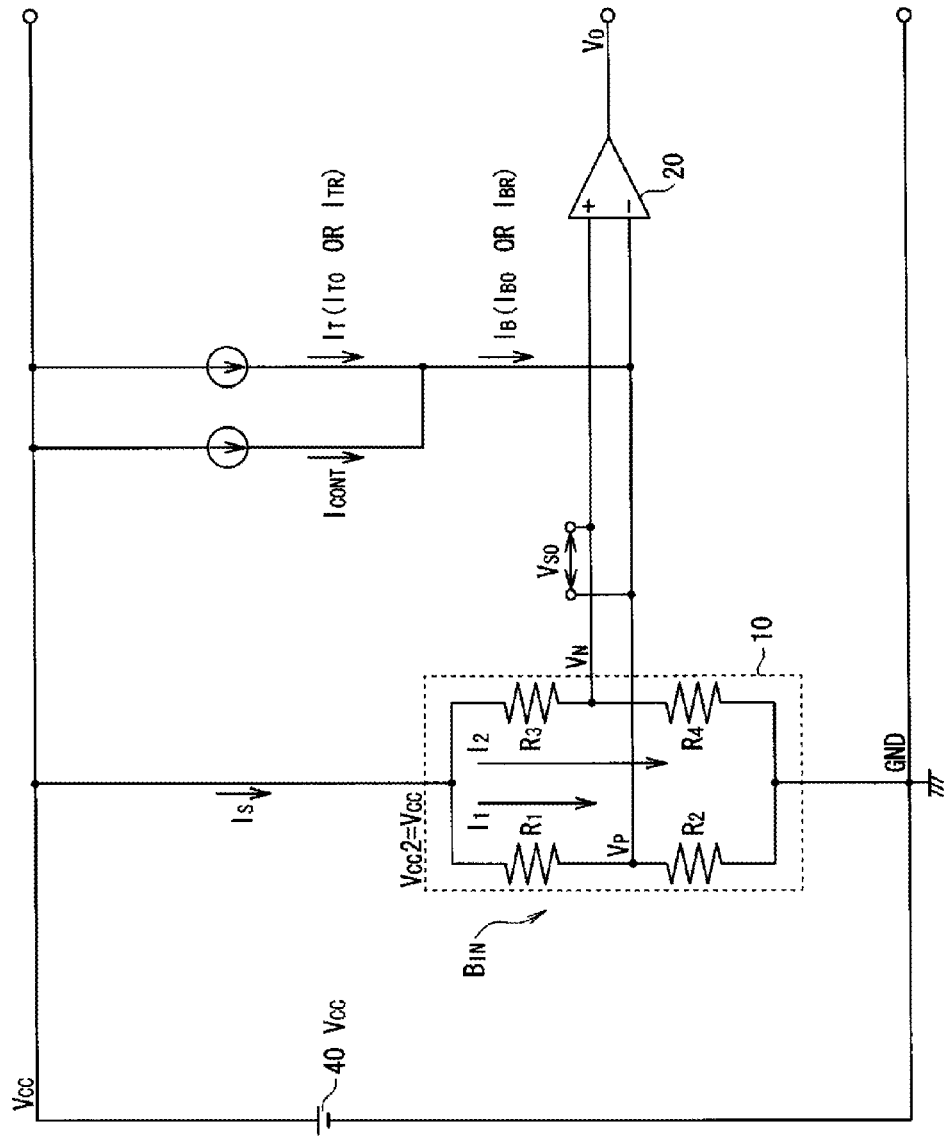
FIG. 2 illustrates a circuit diagram indicative of a circuit configuration with a four-terminal sensor, a voltage comparator, a threshold current $I_T$, and a threshold adjusting current $I_{CONT}$ extracted from FIG. 1.

For simplification of the description, FIG. 2 illustrates a circuit diagram with the four-terminal sensor 10, and the voltage comparator 20, and a sensor drive voltage source 40 extracted from the sensor threshold circuit of FIG. 1, to which the threshold current $I_T$ and the threshold adjusting current $I_{CONT}$ are supplied.

A threshold point $B_{OP}$ will be discussed, while the sensor bias current generating circuit 50 of FIG. 1 is being made to generate the threshold current $I_{TO}$ by the bias current switching circuit 70.

At this moment, the sensor bias current $I_{BO}$ is expressed as the following expression (12), where $1/K_O$ represents a current mirror ratio of the sensor bias current generating circuit 50 and 1/A represents a current mirror ratio of the threshold adjusting current generating circuit 60.

$$I_{BO} = I_{TO} - I_{CONT} \quad (12)$$
$$= I_S/K_O - I_S/A$$

Here, the following expressions (13a) to (13c) are formed.

$$I_1 = (V_{CC} - V_P)/R_1 \quad (13a)$$

$$I_2 = V_{CC}/(R_3 + R_4) \quad (13b)$$

$$V_P/R_2 = I_1 + ((I_1 + I_2)/K_O - (I_1 + I_2)/A)) \quad (13c)$$

When $V_P$ is solved, $$V_P = V_{CC} \times [(1+1/K_O - 1/A)/R_1 + (1/K_O - 1/A)/(R_3+R_4)]/[1/R_2 + (1+1/K_O - 1/A)/R_1] \quad (14)$$

is satisfied. The voltage comparator 20 switches at the voltage satisfying $V_P = V_N$, thereby forming the following expression (15).

$$V_{CC} \times [(1+1/K_O - 1/A)/R_1 + (1/K_O - 1/A)/(R_3+R_4)]/[1/R_2 + (1+1/K_O - 1/A)/R_1] = R_4 \times V_{CC}/(R_3+R_4) \quad (15)$$

In the four-terminal sensor 10, in response to the sensor input $B_{IN}$ applied from the exterior, it is assumed that the balance be lost among the resistors $R_1$, $R_2$, $R_3$, and $R_4$, thereby resulting in $R_1=R_4=R+\Delta R$, $R_2=R_3=R-\Delta R$, or $R_1=R_4=R-\Delta R$, $R_2=R_3=R+\Delta R$. The sensor output voltage $V_{SO} (=V_P-V_N)$ will be generated. Accordingly, if $R_1=R_4=R+\Delta R$ and $R_2=R_3=R-\Delta R$ are satisfied, the expression (16) is formed as follows:

$$\{(1+1/K_O - 1/A)/(R+\Delta R) + (1/K_O - 1/A)/(R-\Delta R + R+\Delta R)\} / \{(1/(R-\Delta R)) + (1+1/K_O - 1/A)/(R+\Delta R)\} = (R+\Delta R)/(R-\Delta R + R+\Delta R) \quad (16)$$

$\Delta R/R$ satisfying the above expression (16) is solved.

$$\Delta R/R = (1/K_O - 1/A)/[2 \times \{1 + 1/2 \times (1/K_O - 1/A)\}] \quad (17)$$
$$\approx 1/(2 \times K_O) - 1/(2 \times A) \equiv B_{OP}$$

That is to say, $\Delta R/R$ satisfying the above expression (17) is the threshold point $B_{OP}$. In this sense, approximation is performed by utilizing constant numbers $K_O$ and $A$ that can be handled as sufficiently great values in the assumed range.

The threshold point $B_{RP}$ will now discussed when the sensor bias current generating circuit 50 of FIG. 1 is made to generate the threshold current $I_{TR}$ by the bias current switching circuit 70.

Here, the sensor bias current $I_{BO}$ is expressed as the following expression (18), where $1/K_R$ represents a current mirror ratio of the sensor bias current generating circuit 50 and $1/A$ represents a current mirror ratio of the threshold adjusting current generating circuit 60.

$$I_{BR} = I_{TR} - I_{CONT} \quad (18)$$
$$= I_S/K_R - I_S/A$$

The threshold point $B_{RP}$ at this point is obtainable by replacing the current mirror ratio $1/K_O$ of the sensor bias current generating circuit 50, included in the expressions (12) to (17), with $1/K_R$.

$$\Delta R/R \approx 1/(2 \times K_R) - 1/(2 \times A) \equiv B_{RP} \quad (19)$$

The hysteresis width $|BH|$, which is produced when the sensor bias current generating circuit 50 is made to switch between the threshold current $I_{TO}$ and the threshold current $I_{TR}$ by the bias current switching circuit 70, will now be discussed.

The hysteresis width $|BH|$ is expressed by the following expression (20).

$$|BH| = |B_{OP} - B_{RP}| \quad (20)$$
$$= |\{1/(2 \times K_O) - 1/(2 \times A)\} - \{1/(2 \times K_R) - 1/(2 \times A)\}|$$
$$= |1/(2 \times K_O) - 1/(2 \times K_R)|$$

What is important in the above expressions (17), (19), 20 obtained according to the above embodiments is that the threshold points BOP and BRP are dependent on a coefficient A, but the hysteresis width $|BH|$ is not dependent on the coefficient A.

In addition, the threshold point is variable by changing the coefficient A.

Furthermore, the above expression (20) exhibits that the hysteresis width $|BH|$ is not dependent on the sensor drive voltage $V_{CC}$.

The above coefficients $K_O$ and $K_R$ are given by the mirror ratio. Accordingly, when the coefficients $K_O$ and $K_R$ are determined, the hysteresis width $|BH|$ is determined to be a single value with no variations in its value, no changes according to temperature, and no changes over time.

Therefore, the sensor threshold circuit according to an aspect of the present invention achieves the hysteresis width that is not dependent on the change in the threshold point.

It is to be appreciated that the sensor bias current $I_B$ produced by the sensor bias current generating circuit 50 and the threshold adjusting current generating circuit 60 is made to be supplied to an output terminal $V_P$ of the four-terminal sensor 10 in the first embodiment of the present invention, but may be supplied to an output terminal $V_N$ instead of the output terminal $V_P$ of the four-terminal sensor 10.

Second Embodiment

Configuration of Second Embodiment

Figure 3:
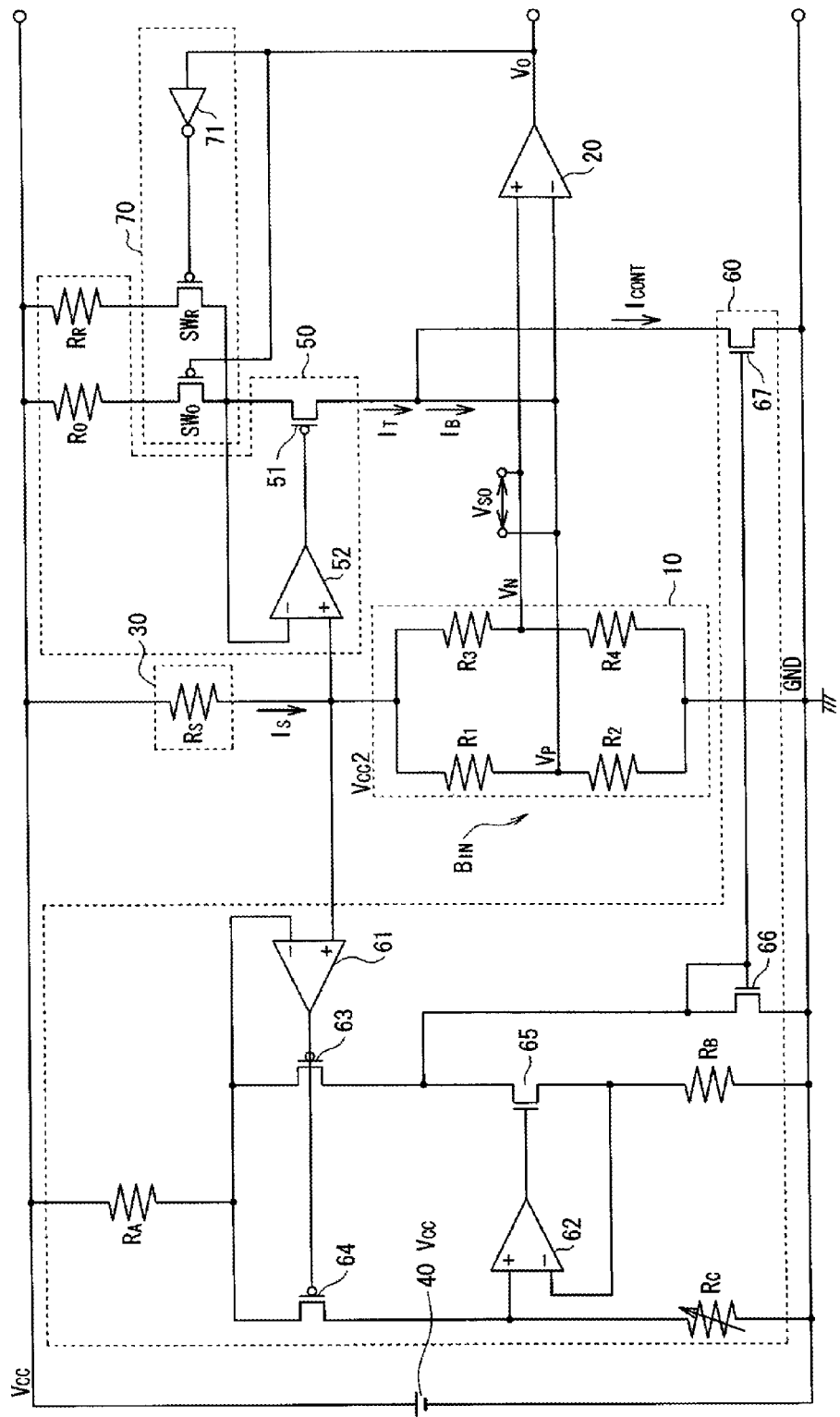
FIG. 3 illustrates a circuit diagram indicative of a configuration of a sensor threshold circuit according to a second embodiment of the present invention.

FIG. 3 illustrates a circuit diagram indicative of a configuration of a sensor threshold circuit according to a second embodiment of the present invention.

The sensor threshold circuit includes: a four-terminal sensor 10; a voltage comparator 20; a sensor drive current detecting circuit 30; a sensor drive voltage source 40; a sensor bias current generating circuit 50; a threshold adjusting current generating circuit 60; and a bias current switching circuit 70. The four-terminal sensor 10 is a resistance type four-terminal sensor, and is any one of Hall elements, magnetic resistive elements, strain sensors, pressure sensors, temperature sensors, and acceleration sensors, for example.

In the sensor threshold circuit, a sensor bias current $I_B$, which has been generated by the sensor bias current generating circuit 50 and the threshold adjusting current generating circuit 60, is supplied to an output terminal of the four-terminal sensor 10, so that a hysteresis characteristic is available at a sensor output voltage $V_{SO} (=V_P-V_N)$, by use of a voltage drop resulted from a product of $I_B \times R_{OUT}$, where $I_B$ represents a sensor bias current and $R_{OUT}$ represents an impedance of an output terminal $V_P$ of the four-terminal sensor 10.

In the sensor threshold circuit with such a configuration, a sensor drive current $I_S$ is detected with the use of a resistor $R_S$ of the sensor drive current detecting circuit 30, and a threshold current $I_T$, which is $1/K$ ($K>0$) times of the sensor drive current $I_S$, is generated at the sensor bias current generating circuit 50. The sensor bias current generating circuit 50 is composed of: a resistor $R_S$; a resistor $R_R$ or a resistor $R_O$ connected by the control of the bias current switching circuit 70; an operating amplifier 52; and a PMOS transistor 51. In this sense, K has two values due to the control of the bias current switching circuit 70, so the sensor bias current generating circuit 50 generates two threshold currents $I_{TO}$ and $I_{TR}$.

Also, a threshold adjusting current $I_{CONT}$, which is 1/A (A>0) times of the sensor drive current $I_S$, is produced at the threshold adjusting current generating circuit 60. The threshold adjusting current generating circuit 60 is composed of: a resistor $R_A$; an operating amplifier 61; a PMOS transistor 63; a PMOS transistor 64; a resistor $R_C$; a resistor $R_B$; an operating amplifier 62; an NMOS transistor 65; an NMOS transistor 66; and an NMOS transistor 67.

The threshold current $I_T$ and the threshold adjusting current $I_{CONT}$ are subtracted at the threshold adjusting current generating circuit 60, and then the sensor bias current $I_B$ is generated. In the second embodiment, the description will be given of current, in which the threshold current $I_{CONT}$ is subtracted from the threshold current $I_T$, is used as the sensor bias current $I_{BO}$. However, the sensor bias current $I_{BO}$ may be current in which the threshold adjusting current $I_{CONT}$ is added to the threshold current $I_T$.

A key point of the sensor threshold circuit according to an aspect of the present invention is configured to produce the threshold current $I_T$ and the threshold adjusting current $I_{CONT}$ based upon the sensor drive current $I_S$, so as to generate the sensor bias current $I_{BO}$ by adding or subtracting the threshold adjusting current $I_{CONT}$ to or from the threshold current $I_T$.

In order to facilitate understanding of the present invention, the threshold current $I_T$ and the threshold adjusting current $I_{CONT}$ in FIG. 3 will now be discussed. Also, for simplification of the description, it is assumed that the resistance value of the resistor $R_S$ for detecting the sensor drive current be considered to be extremely small, as compared to the resistance values of the sensor resistors $R_1$, $R_2$, $R_3$, and $R_4$, thereby making a sensor drive terminal voltage $V_{CC}2$ equal to $V_{CC}$. The resistance value of a sensor drive current detecting resistor $R_S$ may take any value, because the result to be produced later will exhibit that the threshold point is not dependent on the sensor drive voltage $V_{CC}$.

Firstly, the threshold current $I_{TO}$ occurring when the switch $SW_O$ is conductive and the switch $SW_R$ is opened in the bias current switching circuit 70 shown in FIG. 3 will be described.

$$I_{TO}=I_S \times R_S/R_O \qquad (21)$$

For simplification, a current mirror ratio $1/K_O$ of the sensor bias current generating circuit 50 is defined as follows.

$$1/K=R_S/R_O \qquad (22)$$

Next, the threshold current $I_{TR}$ occurring when the switch $SW_R$ is conductive and the switch $SW_O$ is opened in the bias current switching circuit 70 shown in FIG. 3 will be described.

$$I_{TR}=I_S \times R_S/R_R \qquad (23)$$

For simplification, the current mirror ratio $1/K_R$ of the sensor bias current generating circuit 50 is defined as follows.

$$1/K_R=R_S/R_R \qquad (24)$$

Figure 4:
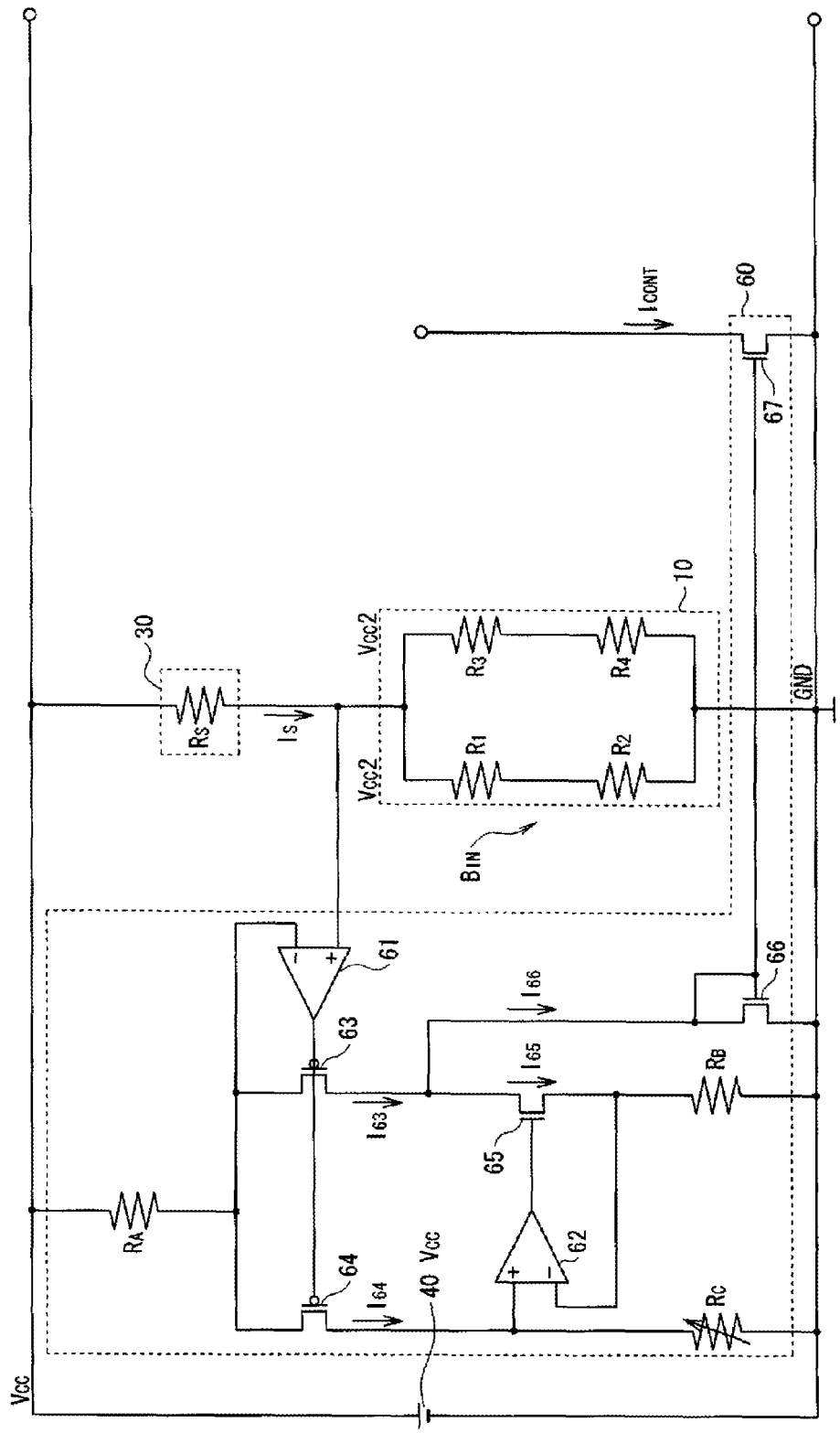
FIG. 4 illustrates a circuit diagram indicative of a circuit configuration with a four-terminal sensor, a sensor drive current detecting circuit, and a threshold adjusting current generating circuit extracted from FIG. 3.

The threshold adjusting current $I_{CONT}$ will be described with the current defined as illustrated in FIG. 4. For simplification of the description, FIG. 4 illustrates a circuit diagram including: the four-terminal sensor 10; the sensor drive current detecting circuit 30; the sensor drive voltage source 40; and the threshold adjusting current generating circuit 60, which are extracted from the sensor threshold circuit of FIG. 3. Here, for brief description, it is assumed that the PMOS transistor 63 and the PMOS transistor 64 have the same electrical characteristics. In addition, it is assumed that the NMOS transistor 66 and the NMOS transistor 67 have the same size electrical characteristics. Further, it is assumed that $R_B > R_C$ be satisfied.

Currents $I_{63}$ and $I_{64}$, which pass across the PMOS transistor 63 and the PMOS transistor 64, respectively, are equal to each other and expressed as the following expression (25).

$$I_{63}=I_{64}=I_S \times R_S/R_A/2 \qquad (25)$$

Current $I_{65}$, which passes across the NMOS transistor 65 and a resistor $R_B$ is expressed as the following expression (26).

$$\begin{aligned} I_{65} &= I_{64} \times R_C/R_B \\ &= I_S \times R_S/R_A/2 \times R_C/R_B \end{aligned} \qquad (26)$$

Current $I_{66}$, which passes across the NMOS transistor 66 and the NMOS transistor 67, and the threshold adjusting current $I_{CONT}$ are equal to each other and expressed as the following expression (27).

$$\begin{aligned} I_{66} &= I_{CONT} \\ &= I_{63} - I_{65} \\ &= (I_S \times R_S/R_A/2) - (I_S \times R_S/R_A/2) \times R_C/R_B \\ &= (I_S \times R_S/R_A/2) \times (1 - R_C/R_B) \end{aligned} \qquad (27)$$

In this sense, the following expression (28) is defined for simplification.

$$1/A = R_S/R_A/2 \times (1-R_C/R_B) \qquad (28)$$

Figure 5:
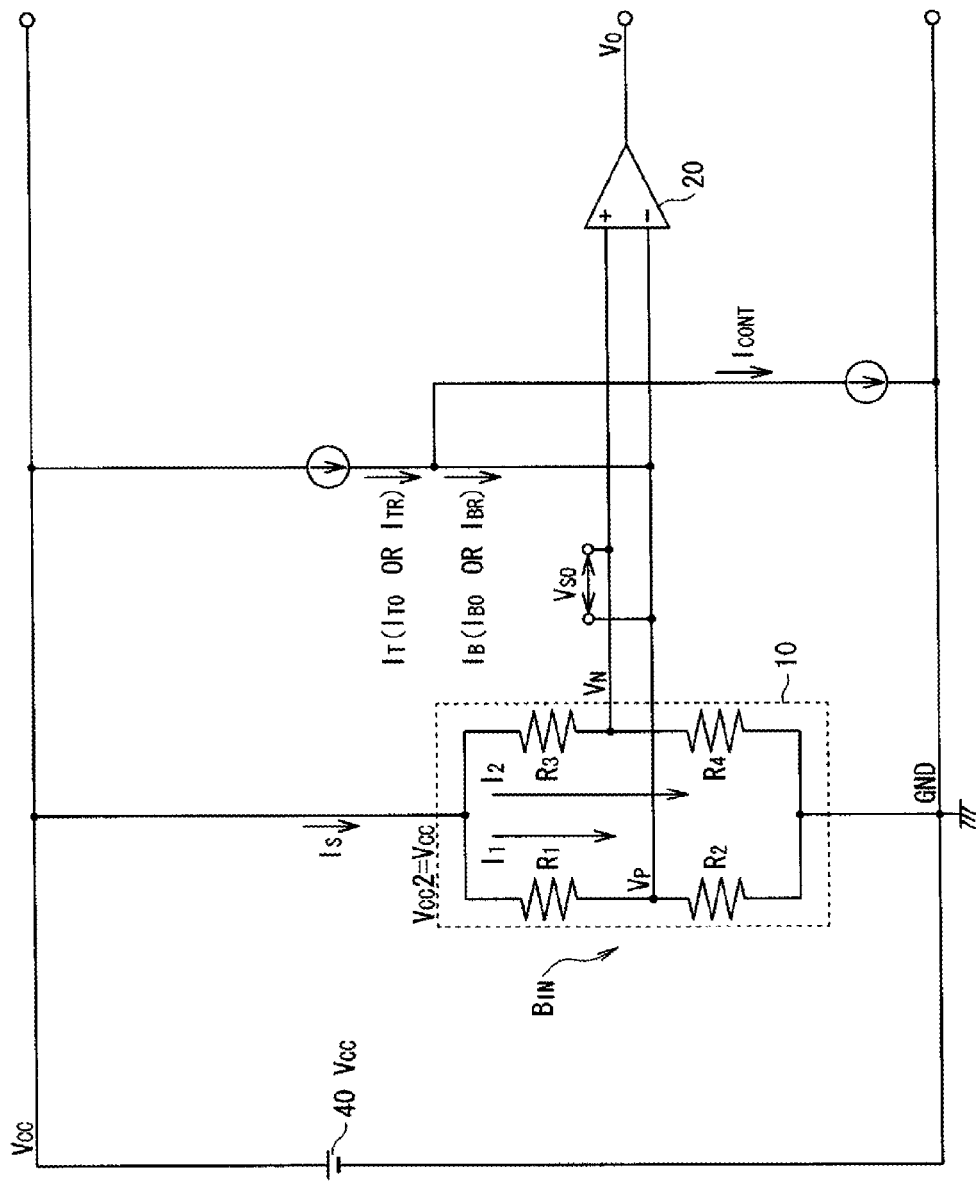
FIG. 5 illustrates a circuit diagram indicative of a circuit configuration with the four-terminal sensor, a voltage comparator, a threshold current $I_T$, and a threshold adjusting current $I_{CONT}$ extracted from FIG. 3.

Currents are defined as illustrated in FIG. 5. For brief description, FIG. 5 illustrates a circuit diagram including: the four-terminal sensor 10; and the voltage comparator 20, which are extracted from the sensor threshold circuit of FIG. 3, and to which the threshold current $I_T$ and the threshold adjusting current $I_{CONT}$ are supplied.

The threshold point $B_{OP}$ occurring when the switch $SW_O$ is conducted and the switch $SW_R$ is opened in the bias current switching circuit 70 of FIG. 3 will be discussed.

In this sense, the threshold current $I_{TO}$ is expressed as the above expression (21), the sensor bias current $I_{BO}$ is expressed as the following expression (29), by use of the above expressions (21), (22), (27), and (28).

$$\begin{aligned} I_{BO} &= I_{TO} - I_{CONT} \\ &= I_S/K_O - I_S/A \end{aligned} \qquad (29)$$

At this point, the following expressions (30a) to (30c) are satisfied.

$$I_1=(V_{CC}-V_P)/R_1 \qquad (30a)$$

$$I_2=V_{CC}/(R_3+R_4) \qquad (30b)$$

$$V_P/R_2=I_1+((I_1+I_2)/K_O-(I_1+I_2)/A) \qquad (30c)$$

When $V_P$ is solved, $$V_P = V_{CC} \times [(1+1/K_O-1/A)/R_1 + (1/K_O-1/A)/(R_3+R_4)]/(1/R_2+(1+1/K_O-1/A)/R_1) \tag{31}$$

is satisfied. The voltage comparator 20 switches at the voltage satisfying $V_P = V_N$, thereby forming the following expression (32).

$$V_{CC} \times [(1+1/K_O-1/A)/R_1 + (1/K_O-1/A)/(R_3+R_4)]/[1/R_2 + (1+1/K_O-1/A)/R_1] = R_4 \times V_{CC}/(R_3+R_4) \tag{32}$$

In the four-terminal sensor 10, in response to the sensor input $B_{IN}$ applied from the exterior, it is assumed that the balance be lost among the resistors $R_1$, $R_2$, $R_3$, and $R_4$, thereby resulting in $R_1 = R_4 = R + \Delta R$, $R_2 = R_3 = R - \Delta R$, or $R_1 = R_4 = R - \Delta R$, $R_2 = R_3 = R + \Delta R$. The sensor output voltage $V_{SO} (=V_P - V_N)$ will be generated. Accordingly, if $R_1 = R_4 = R + \Delta R$ and $R_2 = R_3 = R - \Delta R$ are satisfied, the following expression (33) is formed.

$$\{(1+1/K_O-1/A)/(R+\Delta R) + (1/K_O-1/A)/(R-\Delta R+R+\Delta R)\}/\{1/(R-\Delta R) + (1+1/K_O-1/A)/(R+\Delta R)\} = (R+\Delta R)/(R-\Delta R+R+\Delta R) \tag{33}$$

$\Delta R/R$ satisfying the above expression (33) is solved.

$$\Delta R/R = (1/K_O - 1/A)/[2 \times \{1 + 1/2 \times (1/K_O - 1/A)\}] \tag{34}$$

$$\approx 1/(2 \times K_O) - 1/(2 \times A) \equiv B_{OP}$$

That is to say, $\Delta R/R$ satisfying the above expression (34) is the threshold point $B_{OP}$. In this sense, approximation is performed by utilizing constant numbers $K_O$ and $A$ that can be handled as a sufficiently great value in the assumed range.

The threshold point $B_{RP}$ occurring when the switch $SW_O$ is opened and the switch $SW_R$ is conductive in the bias current switching circuit 70 of FIG. 3 will now be discussed.

Here, the threshold current is expressed as the above expression (33) and the sensor bias current $I_{BR}$ is expressed as the following expression (35) with the use of the expressions (23), (24), (27), and (28).

$$I_{BR} = I_{TR} - I_{CONT} \tag{35}$$

$$= I_S/K_R - I_S/A$$

The threshold point $B_{RP}$ at this point is obtainable in the similar manner by replacing the current mirror ratio $1/K_O$, of the sensor bias current generating circuit 50, included in the expressions (30) to (34), with $1/K_R$.

$$\Delta R/R \approx 1/(2 \times K_R) - 1/(2 \times A) \equiv B_{RP} \tag{36}$$

The hysteresis width |BH|, which is produced by switching between the switch $SW_O$ and the switch $SW_R$ in the bias current switching circuit 70, will now be discussed.

At this point, the hysteresis width |BH| is expressed by the following expression (37).

$$|BH| = |B_{OP} - B_{RP}| \tag{37}$$

$$= |\{1/(2 \times K_O) - 1/(2 \times A)\} - \{1/(2 \times K_R) - 1/(2 \times A)\}|$$

$$= |1/(2 \times K_O) - 1/(2 \times K_R)|$$

Figure 6:
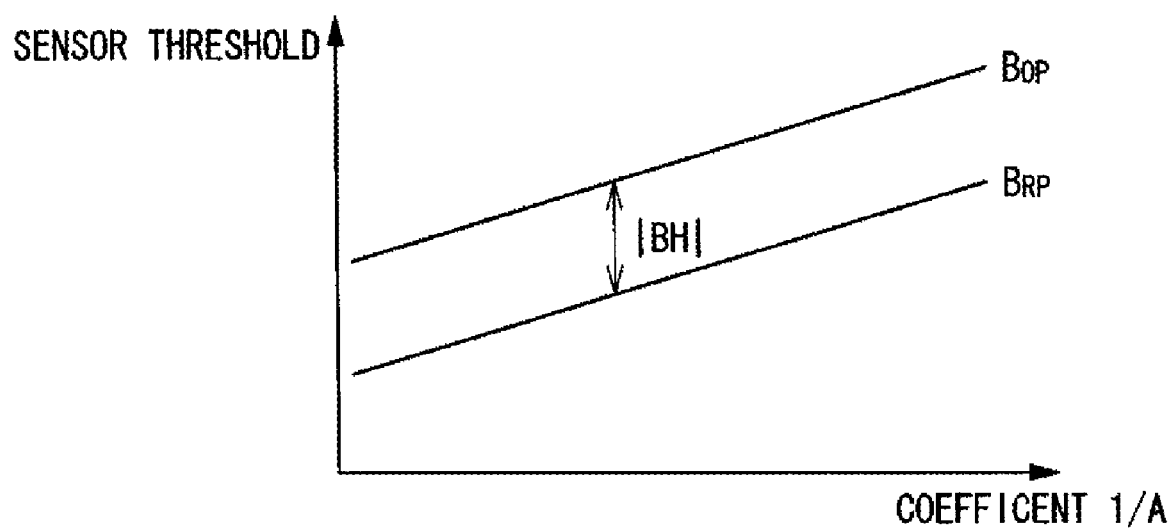
FIG. 6 depicts the relationship between a threshold point and a coefficient 1/A according to an embodiment of the present invention.

FIG. 6 depicts the relationship of the threshold points $B_{OP}$ and $B_{RP}$, the hysteresis width |BH|, and the coefficient $1/A$, which are obtained from the above expressions (34), (36), and (37).

What are important in the above expressions (34), (36), and (37) obtained according to the above embodiment and FIG. 6 are that the threshold points $B_{OP}$ and $B_{RP}$ are dependent on the coefficient A, but the hysteresis width |BH| is not dependent on the coefficient A. In addition, since the above expression (28) exhibits that since the coefficient A depends on the resistance ratio, the threshold point is variable by changing at least one of the resistors. The resistor $R_C$ is illustrated as a variable resistor in FIG. 3 and FIG. 4, but a resistor $R_A$ or a resistor $R_B$ may be a variable resistor.

Also, in changing the threshold point, the resistor $R_A$ is changed when $V_{CC}$ is set as a reference and the resistor $R_B$ or the resistor $R_C$ is changed when GND is set as a reference. Accordingly, the threshold point is variable without depending on the reference voltage. In this sense, the expressions (22) and (24) exhibit that the resistor $R_S$ cannot be changed because the resistor $R_S$ has a coefficient depending on the coefficients $K_O$ or $K_R$. The above expression (37) also exhibits that the hysteresis width |BH| is not dependent on the sensor drive voltage $V_{CC}$.

The above coefficients $K_O$ and $K_R$ are given by the resistance ratio. Accordingly, when the coefficients $K_O$ and $K_R$ are determined, the hysteresis width |BH| is determined to be a single value with no variations in its value, no changes according to temperature, and no changes over time.

Therefore, the sensor threshold circuit according to an aspect of the present invention achieves the hysteresis width that is not dependent on the change in the threshold point.

Third Embodiment

Configuration of Third Embodiment

Figure 7:
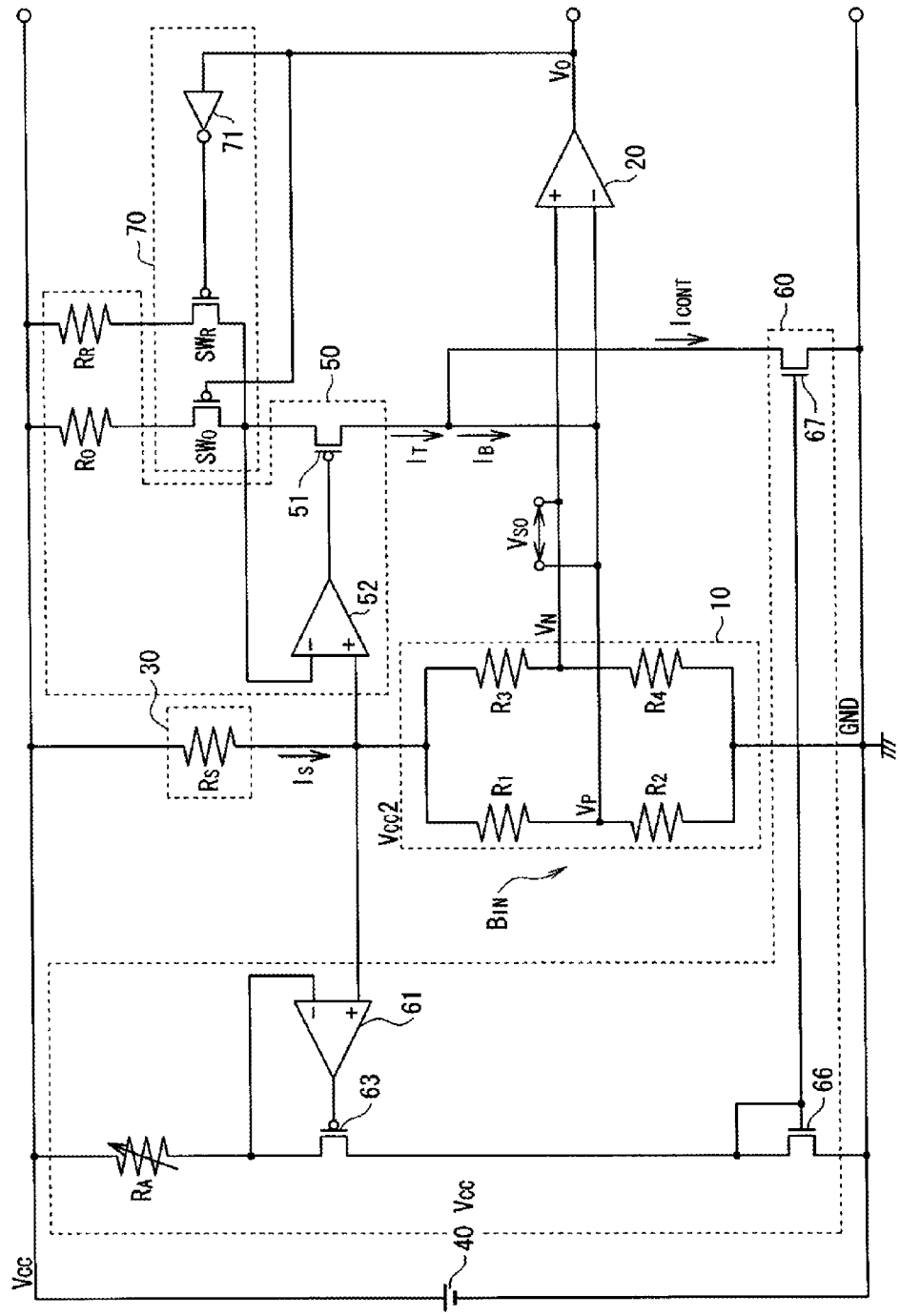
FIG. 7 illustrates a circuit diagram indicative of a configuration of a sensor threshold circuit according to a third embodiment of the present invention.
Figure 8:
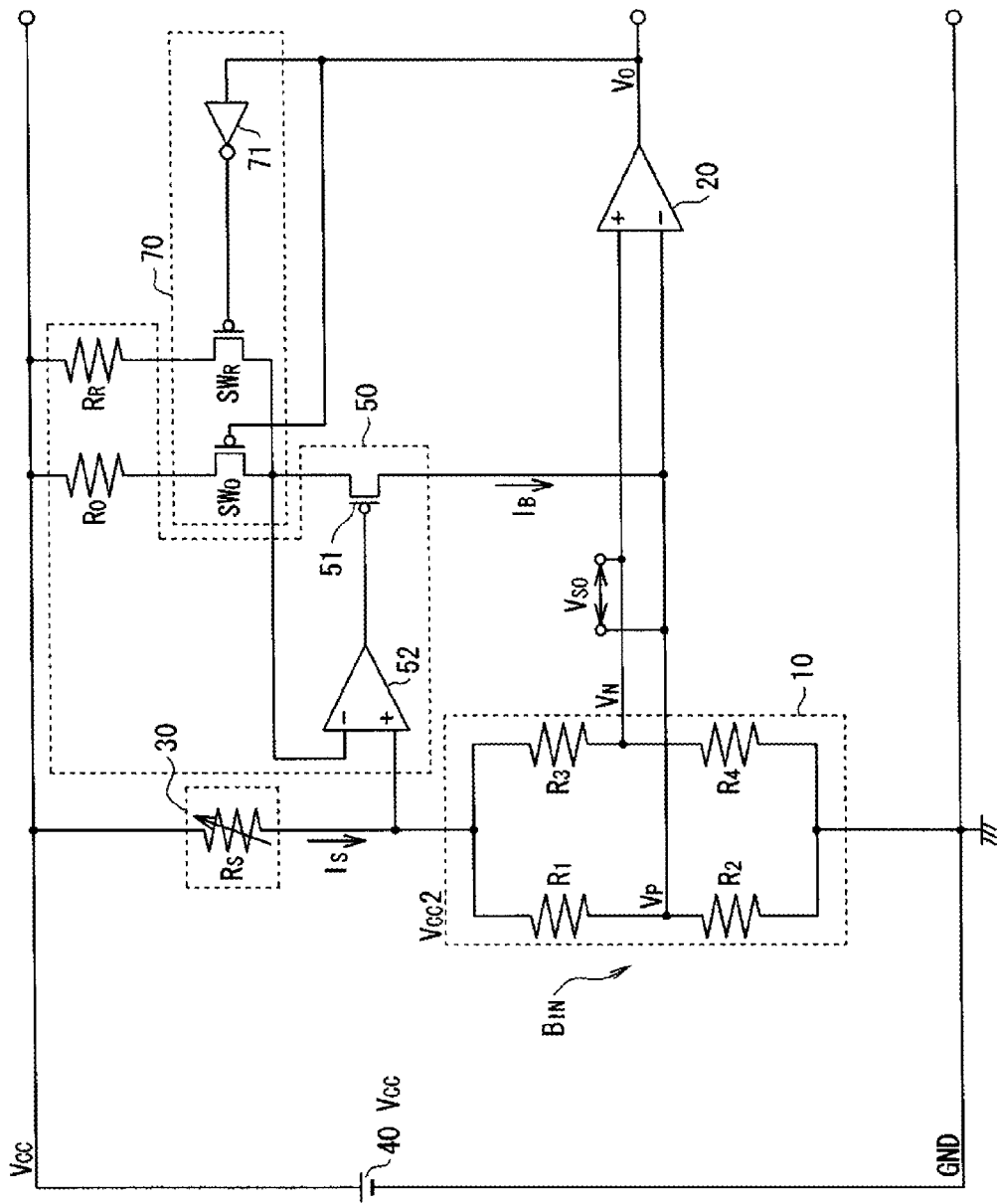
FIG. 8 shows a circuit diagram indicative of a conventional sensor threshold circuit.
Figure 10:
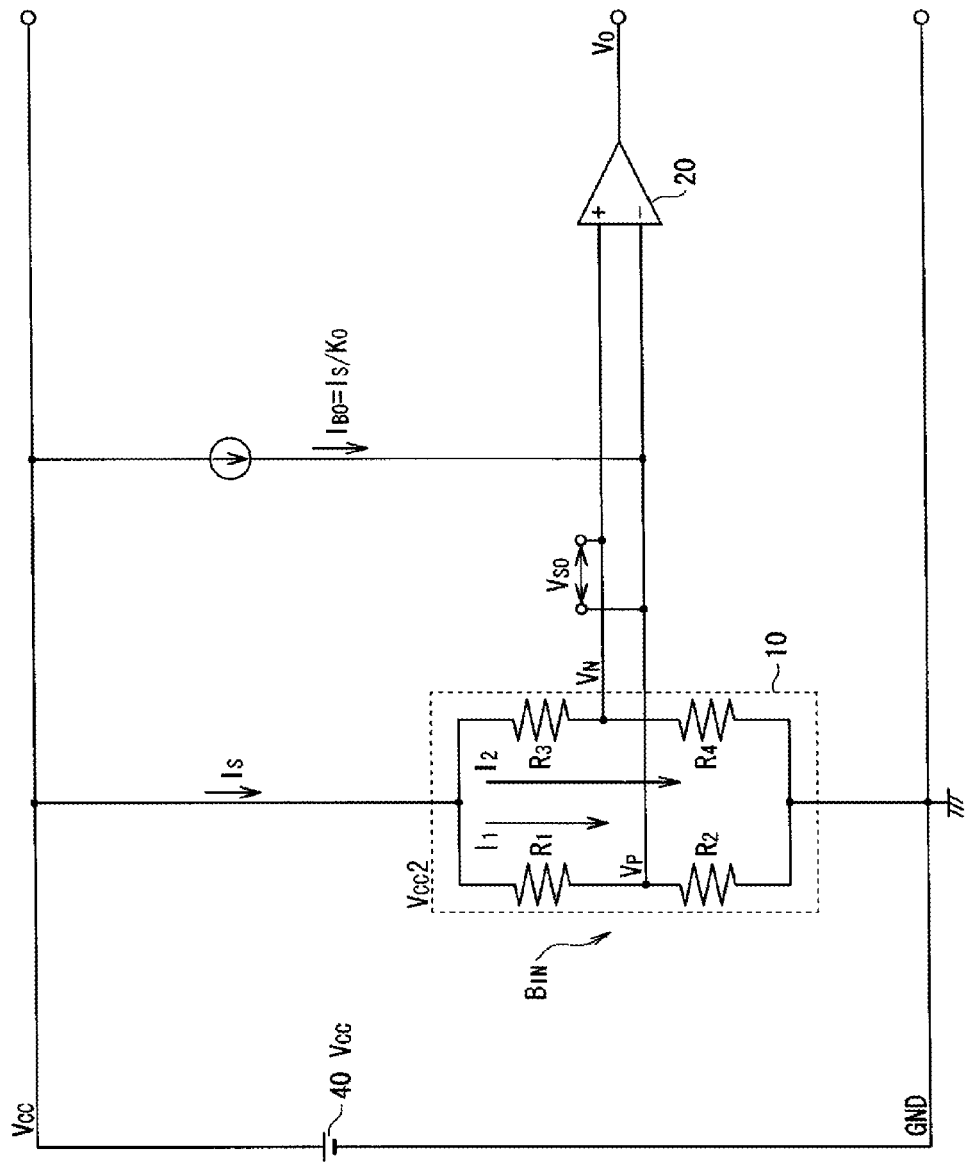
FIG. 10 shows a circuit configuration indicative of a four-terminal sensor, a voltage comparator, and a sensor bias current $I_{BO}$ extracted, with a switch $S_{WO}$ conductive and a $S_{WR}$ opened, from a bias current switching circuit of FIG. 8.
Figure 11:
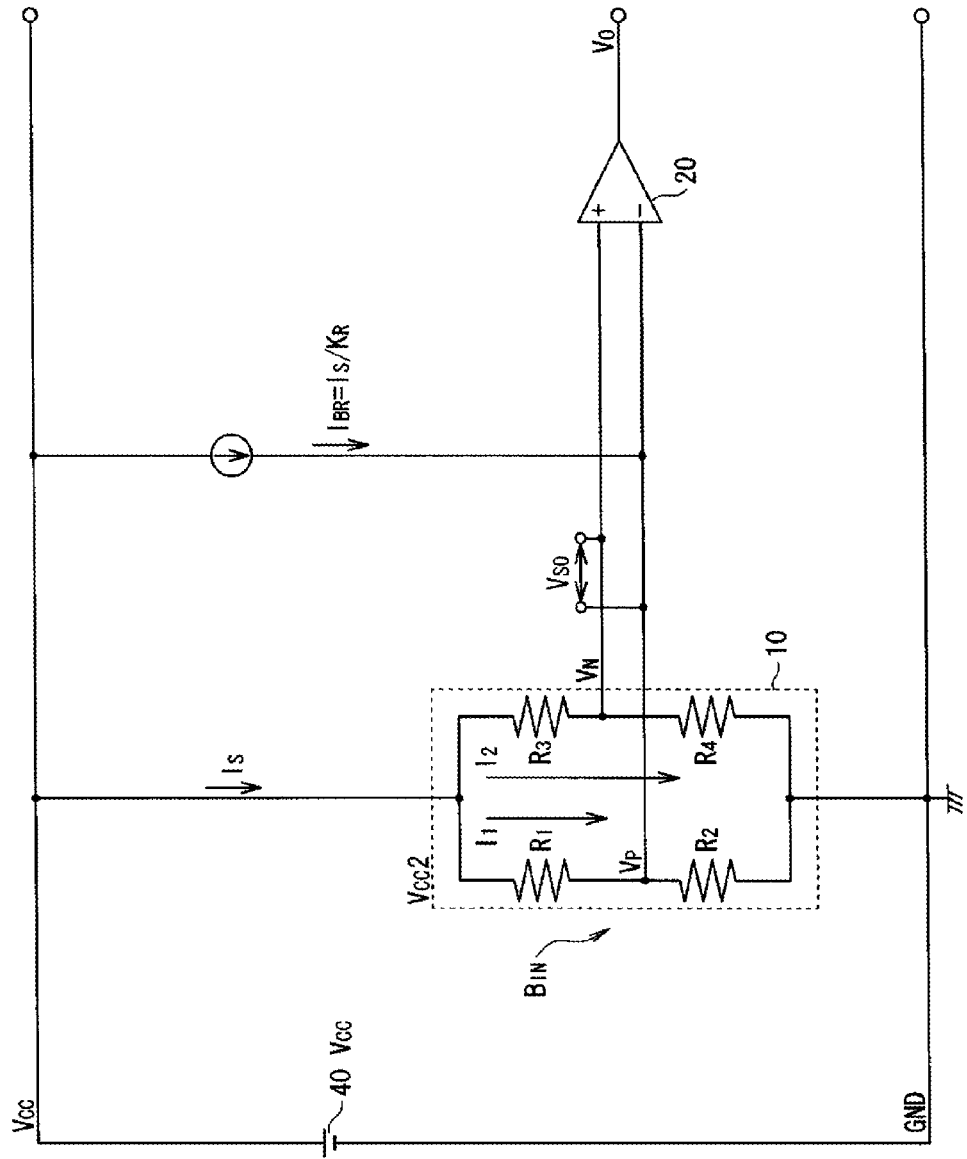
FIG. 11 shows a circuit configuration indicative of the four-terminal sensor, the voltage comparator, and the sensor bias current $I_{BO}$ extracted, with the switch $S_{WO}$ opened and the $S_{WR}$ conductive, from the bias current switching circuit of FIG. 8.
Figure 12:
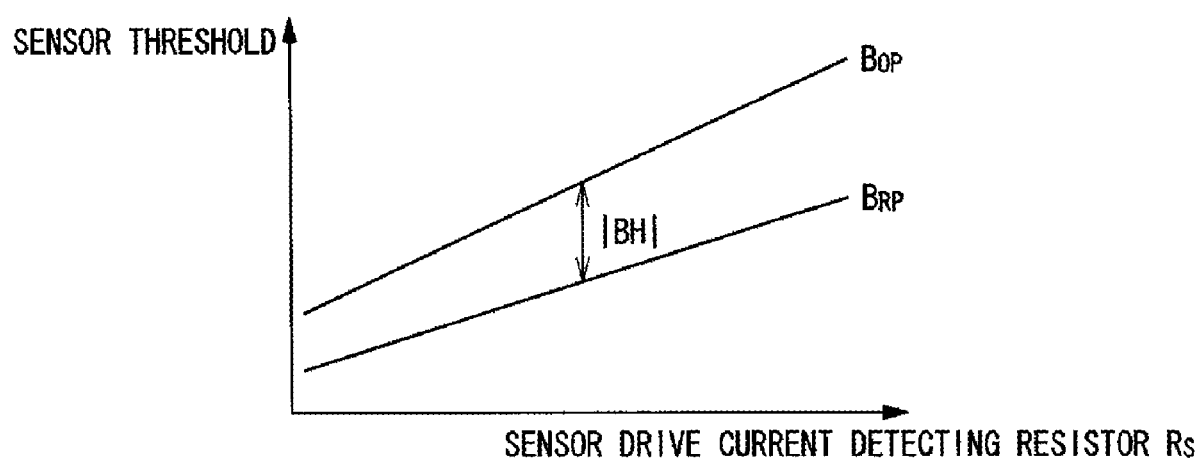
FIG. 12 depicts the relationship of threshold points and a sensor drive current detecting resistor $R_S$ in the conventional sensor threshold circuit.

FIG. 7 illustrates a circuit diagram indicative of a configuration of a sensor threshold circuit according to a third embodiment of the present invention.

The sensor threshold circuit includes: a four-terminal sensor 10; a voltage comparator 20; a sensor drive current detecting circuit 30; a sensor drive voltage source 40; a sensor bias current generating circuit 50; a threshold adjusting current generating circuit 60; and a bias current switching circuit 70. The four-terminal sensor 10 is a resistance type four-terminal sensor, and is any one of Hall elements, magnetic resistive elements, strain sensors, pressure sensors, temperature sensors, and acceleration sensors, for example.

In the sensor threshold circuit, a sensor bias current $I_B$, which has been generated by the sensor bias current generating circuit 50 and the threshold adjusting current generating circuit 60, is applied to an output terminal of the four-terminal sensor 10, so that a hysteresis characteristic is available at a sensor output voltage $V_{SO} (=V_P - V_N)$, by use of a voltage drop resulted from a product of $I_B \times R_{OUT}$, where $I_B$ represents a sensor bias current and $R_{OUT}$ represents an impedance of an output terminal $V_P$ of the four-terminal sensor 10.

In the sensor threshold circuit with such a configuration, a sensor drive current $I_S$ is detected with the use of a resistor $R_S$ of the sensor drive current detecting circuit 30, so a threshold current $I_T$, which is 1/K (K>0) times of the sensor drive current $I_S$, is generated at the sensor bias current generating circuit 50. The sensor bias current generating circuit 50 is composed of: a resistor $R_S$; a resistor $R_R$ or a resistor $R_O$ connected by the control of the bias current switching circuit 70; an operating amplifier 52; and a PMOS transistor 51. In this sense, K has two values due to the control of the bias current switching circuit 70, so the sensor bias current generating circuit 50 generates two threshold currents $I_{TO}$ and $I_{TR}$.

A threshold adjusting current $I_{CONT}$, which is 1/A (A>0) times of the sensor drive current $I_S$ is produced at the threshold adjusting current generating circuit 60. The threshold adjusting current generating circuit 60 is composed of: a resistor $R_A$; an operating amplifier 61; a PMOS transistor 63; an NMOS transistor 66; and an NMOS transistor 67.

The threshold current $I_T$ and the threshold adjusting current $I_{CONT}$ are subtracted at the threshold adjusting current generating circuit 60, so as to generate the sensor bias current $I_B$. In the third embodiment, the description will be given of the sensor bias current $I_{BO}$ used as current, in which the threshold adjusting current $I_{CONT}$ is subtracted from the threshold current $I_T$. However, the sensor bias current $I_{BO}$ may be current in which the threshold adjusting current $I_{CONT}$ is added to the threshold current $I_T$.

Since operations and effects according to the present embodiment of the present invention are same as those of the first and second embodiments, the description thereof will be omitted. Only the above expression (28) is different. The threshold points $B_{OP}$, the threshold point $B_{RP}$, and the hysteresis width |BH| in the sensor threshold circuit of FIG. 7 are considered in the same manner, by replacing 1/A defined in the above expression (28) with the following expression (38).

$$1/A = R_S/R_A \quad (38)$$

Here, for brief description, it is assumed that the NMOS transistor 66 and the NMOS transistor 67 have the same electrical characteristics.

In addition, the above expression (38) exhibits that the coefficient A depends on the resistance ratio. Accordingly, the threshold point is variable by changing a single resistor.

With the configuration described heretofore, as with the first and second embodiments of the present invention, when the coefficients $K_O$ and $K_R$ are determined, the hysteresis width |BH| is determined to be a single value with no variations in its value, no changes according to temperature, and no changes over time. Therefore, the sensor threshold circuit according to an aspect of the present invention achieves the hysteresis width that is not dependent on the change in the threshold point.

The invention claimed is:

1. A sensor threshold circuit that outputs a digital signal with a hysteresis characteristic, in receipt of an input from a sensor, the sensor threshold circuit comprising:
   a voltage comparator that digitizes an output voltage of the sensor;
   a sensor drive current detecting circuit that detects a sensor drive current;
   a sensor bias current generating circuit that generates a threshold current, wherein the magnitude of the threshold current is 1/K (where K>0) times the magnitude of the sensor drive current that has been detected by the sensor drive current detecting circuit, and wherein the threshold current is based upon the output from the voltage comparator;
   a threshold adjusting current generating circuit that generates a threshold adjusting current wherein the magnitude of the threshold adjusting current is 1/A (where A>0) times the magnitude of the sensor drive current that has been detected by the sensor drive current detecting circuit, wherein the threshold adjusting current generating circuit adds or subtracts the threshold adjusting current to or from the threshold current that has been generated by the sensor bias current generating circuit to generate a sensor bias current, and wherein the threshold adjusting current generating circuit supplies the sensor bias current to an output terminal of the sensor.

2. The sensor threshold circuit according to claim 1, further comprising a bias current switching circuit that switches between a first resistor and a second resistor, based upon an output from the voltage comparator,
   wherein the sensor bias current generating circuit generates the threshold current, based upon the first resistor or the second resistor connected by the bias current switching circuit.

3. The sensor threshold circuit according to claim 2, wherein the threshold adjusting current generating circuit includes: a first resistor for changing a threshold point with a sensor drive voltage used as a reference;
   second and third resistors for changing the threshold point with GND used as the reference; and
   an operating amplifier, and
   said I/A satisfies the equation:

$$1/A = (R_S/(R_A/2)) \times (1 - R_C/R_B)$$

where $R_A$ represents a resistance value of the first resistor, $R_B$ and $R_C$ (where $R_B > R_C$) represent resistance values of the second and third resistors, respectively, and $R_S$ represents a resistance value of a resistor in the sensor drive current detecting circuit.

4. The sensor threshold circuit according to claim 3, wherein at least one of the first, second, and third resistors is a variable resistor.

5. The sensor threshold circuit according to claim 1, wherein the threshold adjusting current generating circuit includes: a first resistor for changing a threshold point with a sensor drive voltage used as a reference; and an operating amplifier, and said 1/A satisfies a following expression, $$1/A = R_S/R_A$$

where $R_A$ represents a resistance value of the first resistor, and $R_S$ represents a resistance value of a resistor in the sensor drive current detecting circuit.

6. The sensor threshold circuit according to claim 5, wherein the first resistor is a variable resistor.

7. The sensor threshold circuit according to any one of claim 1 to claim 6, wherein $1/K = R_S/R_O$ is formed when only the first resistor is conductive, and $1/K = R_S/R_R$ is formed when only the second resistor is conductive, where $R_O$ represents a resistance value of the first resistor and $R_R$ represents a resistance value of the second resistor.

8. The sensor threshold circuit according to any one of claim 1 to claim 6, wherein the sensor is a four-terminal sensor and is any one of a sensor using a Hall element, a sensor using a magnetic resistive element, a strain sensor, a pressure sensor, a temperature sensor, and an acceleration sensor.

* * * * *